United States Patent
Lin et al.

[11] Patent Number: 5,985,764
[45] Date of Patent: Nov. 16, 1999

[54] LAYER INDEPENDENT ALIGNMENT SYSTEM

[75] Inventors: Chuan-Chieh Lin, Hsin-Chu; Wen-Jye Chung, Shuang-Shi-Hsiao-Cheng, both of Taiwan

[73] Assignee: Taiwan Semiconductor Manufacturing Company, Ltd., Hsin-Chu, Taiwan

[21] Appl. No.: 08/995,994

[22] Filed: Dec. 22, 1997

[51] Int. Cl.$^6$ .................................................. H01L 21/00
[52] U.S. Cl. ............................ 438/692; 438/16; 438/694
[58] Field of Search .................................. 216/38, 59, 60, 216/84, 85; 438/8, 9, 14, 16, 691, 692, 694, 697, 720, 742, 754

[56] References Cited

U.S. PATENT DOCUMENTS

| | | | |
|---|---|---|---|
| 3,752,589 | 8/1973 | Kobayashi | 350/30 |
| 4,046,985 | 9/1977 | Gates | 219/121 |
| 4,534,804 | 8/1985 | Cade | 148/1.5 |
| 5,401,691 | 3/1995 | Caldwell | 438/692 X |
| 5,783,490 | 7/1998 | Tseng | 438/692 |
| 5,872,042 | 2/1999 | Hsu et al. | 438/692 X |
| 5,897,371 | 4/1999 | Yeh et al. | 438/692 X |

OTHER PUBLICATIONS

S. Wolf, "Silicon Processing for the VLSI Era" vol. 2, Lattice Press, Sunset Beach, CA, 1990, pp. 203, 476.

*Primary Examiner*—William Powell
*Attorney, Agent, or Firm*—George O. Saile; Stephen B. Ackerman

[57] ABSTRACT

A method is disclosed for aligning wafers independent of the planarity of layers that are formed on a wafer. In prior art, it is found that when aligning wafers from the front or device side, the alignment of the masks vary because of the variations on the topography of the particular layer in process. Since the topography of a layer is influenced by the cumulative effect of the number of underlying features that are disposed on top of each other, severe misalignments can occur causing defective parts. The problem is eliminated by depositing an infrared reflective (IR) coating over alignment marks formed on oxide layer covering the devices on a wafer, and performing alignment with respect to the reflective marks by projecting IR energy through an IR transparent stage placed under the backside of the wafer and using an IR microscope. Since silicon substrate is also IR transparent, alignment can be performed from the back side in exactly the same way each time the wafer is aligned independent of the layer topography on the front side.

17 Claims, 2 Drawing Sheets

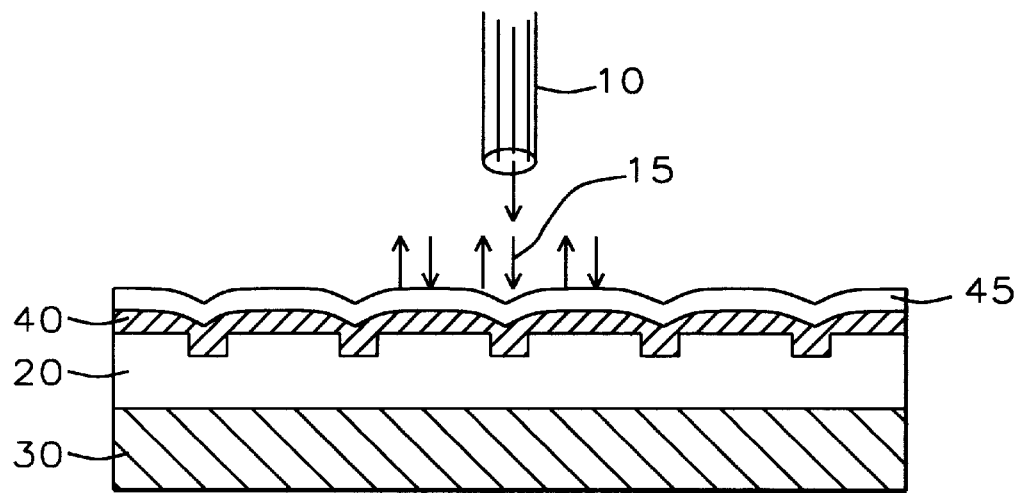
*FIG. 1a - Prior Art*
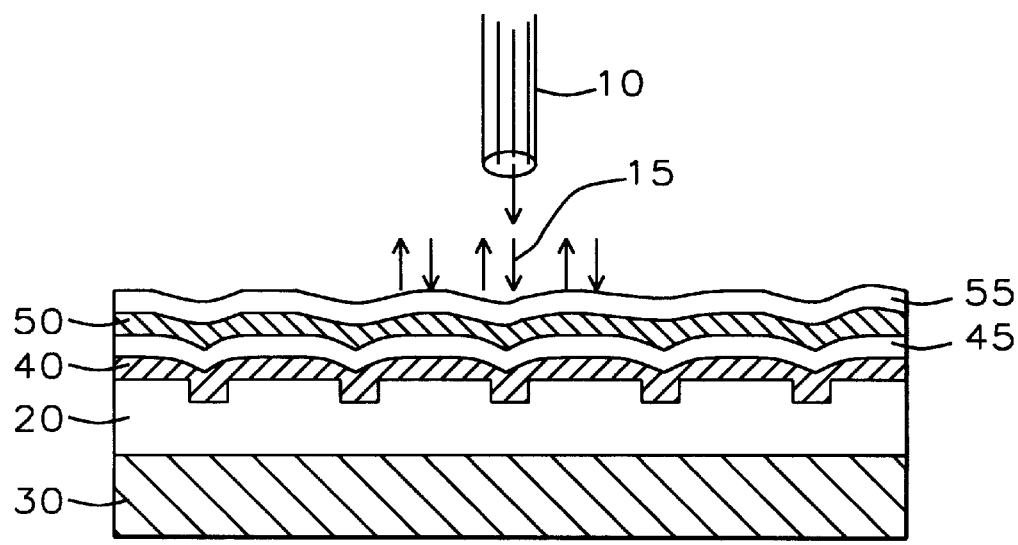
*FIG. 1b - Prior Art*

LAYER INDEPENDENT ALIGNMENT SYSTEM

BACKGROUND OF THE INVENTION (1) Field of the Invention

The present invention relates generally to aligning wafers, and in particular, to aligning wafers independent of the layers formed therein in the manufacture of integrated circuits.

(2) Description of the Related Art

Alignment marks and aligning wafers with respect to those marks are an important part of the process of manufacturing semiconductor devices and integrated circuits. As is known in the art, integrated circuits are fabricated by patterning a sequence of masking layers, and the features on successive layers bear a spatial relationship to one another. Thus, as a part of the fabrication process each level must be aligned to the previous levels. Alignment of one pattern layer to previous layers is done with the assistance of special alignment patterns designed on to each mask level. When these special patterns are aligned, it is assumed that the remainder of the circuit patterns are also correctly aligned. Since each layer must have alignment marks for proper registration with respect to the next layer, each alignment or registration then becomes layer dependent.

The tools that are used to pattern the various layers in a wafer are known as photomasks or masks and reticles. The patterns on the mask or the reticle are defined by a combination of opaque and translucent areas. A light source through the mask or the reticle projects the patterns onto the surface of a wafer, and depending upon the material that is being exposed to the light, the pattern is transferred on to the surface where the light arrives or not. A mask contains patterns that can be transferred to an entire wafer in one exposure. A reticle, on the other hand, contains a pattern image which must be stepped and repeated in order to expose an entire substrate.

The adjustment of the image of the mask being exposed to the previously produced patterns was originally performed by human operators, who compared the image locations under a microscope and adjusted the position of the mask to bring it into alignment with wafer patterns. Decreasing feature sizes, and the increasing number of alignments per wafer with step-and-repeat projection aligners, have been the impetus for developing automatic alignment systems. The principle of one type of automatic alignment procedure is illustrated on page 476 of S. Wolf's book, "Silicon Processing for the VLSI Era," vol. 2, Lattice Press, Sunset Beach, Calif., 1990. Alignment marks consisting of two rectangular patterns, each set at a 45° angle to the directions of the motion an xy-stage table are fabricated on a wafer. Two corresponding rectangular patterns are located on the reticle of an optical aligner, and their image is projected onto the wafer. The superimposed alignment target and the reticle image are reflected back into the main optical element of the aligner, and then into an on-axis microscope. The image from the microscope is focused onto the face of a TV camera, and is subsequently digitized into a form that can be analyzed by a computer. When alignment is achieved, a signal is generated. The 45° orientation of the alignment marks makes it possible to obtain both x an y registration information from the horizontal scan-lines of the video camera. The relative position of the wafer marks with respect to the reticle windows determines the registration of the two images.

Registration and alignment in wafer steppers are performed globally and locally. Global alignment performs rotational and translational alignment of the entire wafer, while local alignment provides alignment to a target within a particular region of a pattern image on the wafer. Global alignment is usually accomplished at a remote alignment station before a wafer is moved under the projection lens for exposure. An apparatus for global aligning is disclosed in U.S. Pat. No. 4,046,985, though for a different purpose other than for aligning masks. The aforementioned apparatus aligns the wafer to a fixed reference position, inverts the aligned wafer to expose its backside and transfers it with controlled motion to a set position under a laser apparatus. The laser beam scans the backside of the wafer to create in a kerf area between chip sites on the wafer an easily breakable cut for the purpose of subsequently separating and removing the chips. This method of aligning differs from the method that will be disclosed in the present invention.

U.S. Pat. No. 3,752,589 discloses a method of aligning the pattern of a photomask on one side of a wafer to the patterns placed on the underside of the wafer. The alignment of the mask with respect to the wafer is achieved by optically superimposing the images present on the mask and on the underside of the wafer and adjusting the mask relative to the wafer until the relative positions of the combined images are corrected to a predefined set of conditions. This method requires two viewing apparatus: one for the mask facing the wafer and the other on the opposing side facing the underside of the wafer, which is superfluous in the present invention as disclosed later in a preferred embodiment.

Cade, in U.S. Pat. No. 4,534,804, on the other hand, teaches a method of forming a laser alignment mark such that same mark now extending, after heat treatment, to both the front and the back of the wafer can be used to align photoresist photomasks to both the front and the back side of a silicon wafer. The alignment mark that is formed is actually a defect planted into the wafer by means of a laser beam. The wavelength of the laser beam is chosen such that it passes through the lightly doped wafer without absorption but is absorbed by a following heavily doped semiconductor layer to generate therein heat and resulting defect. The semiconductor wafer is then heated to cause the defects to migrate through a lightly doped epitaxial layer to the front surface thereof in which there is formed an identically positioned image of the mark scribed on the back side. It will be appreciated, however, that this method is limited to contiguous semiconductor materials without any intervening other types of layers.

Generally, the process of aligning masks in fabricating semiconductor devices in a substrate, and, subsequently, in "metallizing" or wiring the devices together to form integrated circuits on the substrate require different considerations. Up to the level where devices are fabricated, the alignment of masks is accomplished by projecting infrared rays from the underside of the wafer while observing the patterns by an infrared microscope. But this method is not applicable when metallized layers are present because metallic films are opaque to infrared rays. Similarly, the method of U.S. Pat. No. 4,534,804 cannot applied since the metallized layer would preclude the migration of a laser defect through it.

The process of metallization, or "personalization" requires the patterning of the metal layers to form the desired circuit pattern. This is accomplished by masking the metal layer with a photosensitive emulsion and then positioning a photographic mask thereon. The emulsion is next exposed to ultraviolet rays though the photographic mask and then the emulsion is developed and the unexposed emulsions is washed away with solvent. The exposed metal areas are then etched to form wiring patterns corresponding to those on the mask. Certain predetermined areas on the metal layer do also contain alignment marks for registration with the next level of metal layer to be deposited.

Before the next metal layer is deposited, however, an interlevel layer of a dielectric insulator is first blanket deposited over the wiring layer. An interlevel layer usually will form a relatively rough topography conforming to the geometrical features of the underlying layer. Since the depth-of-field limitations of submicron optical-lithography tools require surfaces to be planar within ±0.5 micrometers (See S. Wolf and R. N. Tauber, "Silicon Processing for the VLSI Era," vol. 2, Lattice Press, Sunset Beach, Calif., 1990, p. 203), planarization, as is well known in the field, of the dielectric layer will also be required if optical lithography is to be usable for fabricating integrated circuits with submicron feature sizes of today. Conventionally, planarization is performed in any number of ways including mechanical polishing, or a combination of mechanical and chemical polishing, called CMP. It will be appreciated that as more layers of metal and interlevel dielectric are deposited, the surface topography of each layer will vary because of the cumulative effect of the number of underlying features that are disposed on top of each other. Hence, the photographic alignment of masks of each layer to the preceding layer will depend upon the nature of the planarized surfaces of each layer, and therefore will vary accordingly. A method is disclosed in this invention where the layer dependency of alignment is eliminated.

To appreciate the layer dependency of alignment and its effects thereof, FIGS. 1a and 1b show a conventional system where wafer (20) is disposed between a movable xy-stage (30) and an alignment source (10). The rays emanating from source (10) are shown by numeral (15) in both FIGS. 1a and 1b. In FIG 1a, wafer (20) is provided with one level of metal (40), or wiring layer, and in FIG. 2a, with two levels of metal, where the second wiring layer is denoted by numeral (50). First and second metal layers, (40) and (50), respectively, are separated by an interlevel dielectric layer (45), and second layer (50) has on it dielectric layer (55). As is commonly used in the manufacture of semiconductor wafers, the interlevel dielectric layers (45) and (55) shown in FIGS. 1a and 1b are spin-on-glass, or SOG. For the reasons given earlier, both of the dielectric layers are subjected to planarization by means of chemical-mechanical polishing before the respective metals layers are deposited thereon. However, it will be noted that the roughness or non-planarity of second dielectric layer (55) is more pronounced than that of the first layer (45). This is because, as the number of metal interconnect levels are increased, the stacking of additional layers on top of one another produces a more and more rugged topography as mentioned earlier. Although polishing creates more planarity, nonetheless, the remaining non-planarity varies from one layer to another depending upon the cumulative effect on the topography of the underlying layer. As a result, the patterns on layer (50) visible through the second interlevel layer (55), for example, are more diffused and not as clear as the patterns on layer (40) are through layer (45). Furthermore, the depth-of-field varies from layer to layer on the optical-lithography tools that are used for aligning masks over different layers. Consequently, the signals generated by the edges of the patterns on metal layers vary depending upon the planarity of the layer over which a mask is placed. In other words, the signals for aligning masks over patterns and alignment marks on a wafer are layer dependent, and are sometimes weak, and at other times not distinct so as to cause misalignment and therefore product defects. What is needed, therefore, is a method whereby the aligning and alignment signals are independent of a particular layer over which a mask is positioned and that the alignment signal strength is invariant throughout the manufacture of a semiconductor substrate.

SUMMARY OF THE INVENTION

It is therefore an object of this invention to provide a layer independent alignment system for manufacturing semiconductor wafers.

It is another object of this invention to provide a method for aligning masks accurately over semiconductor wafers.

It is still another object of this invention to provide a method for preventing misalignment of layers in the manufacture of substrates.

In accordance with the aforementioned objects, there is provided a method for depositing infrared (IR) reflective film on a wafer having alignment marks; fabricating other layers on said IR film; mounting the wafer on an IR transparent stage; projecting infrared rays from an alignment tool on the underside of the stage towards the IR reflective film on the alignment marks of the wafer; and aligning the marks on the wafer to a predetermined set of marks on the reticle of the alignment tool.

BRIEF DESCRIPTION OF THE DRAWINGS

The objects and features of this invention will become apparent more readily from a reading of the detailed description in conjunction with the drawings that follow:

FIG. 1a is a schematic drawing of a prior art alignment source in relation to a conventional wafer containing one level of metal layer and placed on a conventional stage.

FIG. 1b is a schematic drawing of a prior art alignment source in relation to a conventional wafer containing a plurality of metal layers and placed on a conventional stage.

DESCRIPTION OF THE PREFERRED EMBODIMENTS

Figure 2A:
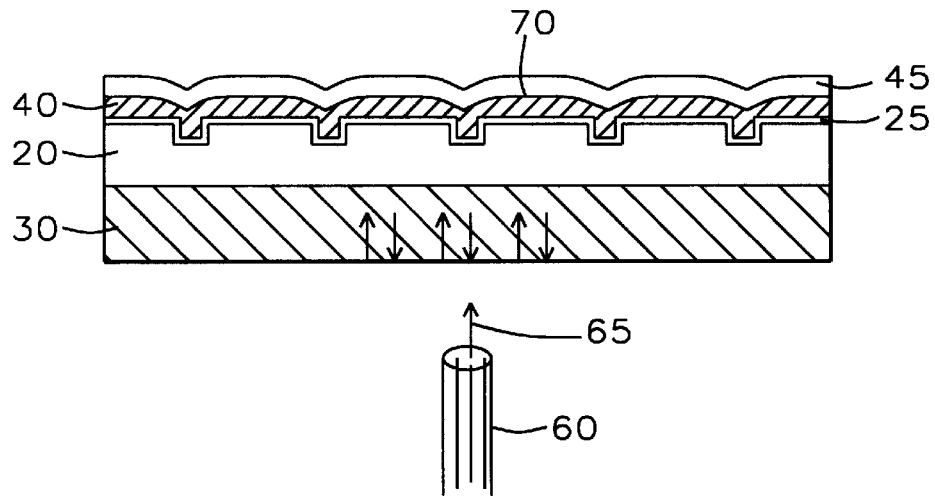
FIG. 2a is a schematic drawing of an alignment source in a new relationship to a wafer containing one level of metal layer and having an infrared (IR) reflective layer of this invention, and placed on a movable stage transparent to IR rays according to this invention.
Figure 2B:
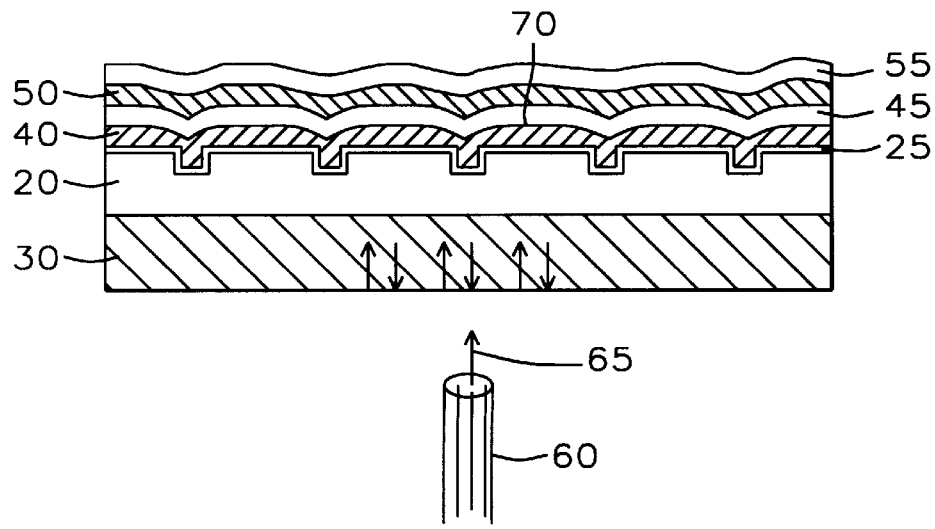
FIG. 2b is a schematic drawing of an alignment source in a new relationship to a wafer containing a plurality of metal layers and having an infrared (IR) reflective layer of this invention, and placed on a movable stage transparent to IR rays according to this invention.

Referring now to the drawings, in particular to FIGS. 2a and 2b, there are shown wafers (20) which have been positioned in relation to an aligner with a light source (60). Optical aligners used in semiconductor manufacturing are well known in the art and as they are not significant to the invention, they are not described in detail here in order not to unnecessarily obscure the present invention. It is preferred, however, that the light source used for exposure in the aligner is a mercury-vapor lamp. It is further preferred that of the electromagnetic spectrum emitted by the mercury vapor the wavelength utilized is in the infrared (IR) range. It will be noted that visible light is bounded on either side of the electromagnetic spectrum by IR and ultraviolet radiation (IR), the former having longer and the latter shorter wavelength than that of the visible light whose wavelength lies between about 45 to 65 nanometers.

The placement of source (60) with respect to wafer (20) is important. In contrast to prior art methods where the alignment source is in general positioned frontally with respect to the wafer as shown in FIGS. 1a and 1b, it is disclosed here that the preferred placement of the aligner and its associated light source is on the side opposite to the front, that is, towards the underside of the wafer.

The advantage of placing source (60) on the underside of wafer (20) becomes apparent once it is realized that the silicon wafer is transparent to IR rays (65) and that they can be reflected back by incorporating a reflective layer in the wafer. A main feature and key spirit of the present invention is precisely the presence of an IR reflective film (70) at a judiciously chosen location in wafer (20). This is because, as has already been explained above in the related prior art, conventional alignment methods are layer dependent. That is, alignment performed by viewing alignment marks from the front side of the wafer is continuously degraded as more layers are added after having formed the semiconductor devices. On the other hand, by having the alignment marks on a special layer (70) deposited just before- that is below- the metallized layers shown in FIGS. 2a and 2b, and having that special layer respond to an alignment illumination arriving from the side opposite to the metallized layers, that is, from underside of wafer (20), layer independent alignment is achieved. Layer (70) responds to IR rays (65) by reflecting them back to the aligner (60). Aligner (60) combines the reflected image with the image that is on the mask or the reticle and the appropriate adjustment is made either manually or automatically depending upon the equipment used. Reflective layer (70) is deposited on alignment marks (25) that are already formed on wafer (20).

A movable xy-table, or stage (30) holds wafer (20) to be aligned. In order to allow the optical alignment be achievable from underside of wafer (20), an important feature of the present invention is the physical properties of stage (30). It is preferred that wafer (20) is held on to a movable xy-stage comprising quartz which is transparent to IR rays. Furthermore, stage (30) is fitted with appropriate means for holding the wafer securely onto the stage.

While the invention has been particularly shown and described with reference to the preferred embodiments thereof, it will be understood by those skilled in the art that various changes in form and details may be made without departing from the spirit and scope of the invention.

What is claimed is:

1. A method for aligning wafers comprising the steps of:
   providing a semiconductor wafer having devices formed within and on its surface and with an oxide layer thereover;
   forming patterns on said oxide layer;
   depositing a reflective layer on said patterns on said oxide layer;
   depositing a first interlevel dielectric layer over said reflective layer;
   planarizing said first dielectric layer;
   depositing a first metal layer on said first dielectric layer;
   depositing a photoresist on said first metal layer;
   placing said wafer on a stage;
   positioning said aligner underside said stage thereat;
   projecting infrared energy onto said wafer;
   focusing and aligning on said reflective layer;
   forming patterns on said first metal layer; and
   repeating the steps above for additional metal layers.

2. The method of claim 1, wherein said wafer is silicon substrate.

3. The method of claim 1, wherein said oxide layer is silicon oxide.

4. The method of claim 1, wherein said patterns are alignment marks.

5. The method of claim 1, wherein said reflective layer reflects infrared energy.

6. The method of claim 1, wherein said first dielectric layer is spin-on-glass (SOG).

7. The method of claim 1, wherein said planarization is chemical-mechanical polishing (CMP).

8. The method of claim 1, wherein said metal is blanket deposited.

9. The method of claim 1, wherein said photoresist is blanket deposited.

10. The method of claim 1, wherein said stage is a movable xy-table.

11. The method of claim 1, wherein said stage is transparent to infrared energy.

12. The method of claim 1, wherein said stage comprises quartz.

13. The method of claim 1, wherein said wafer is secured to said stage by means of vacuum.

14. The method of claim 1, wherein said aligner is an infrared microscope.

15. The method of claim 1, wherein said microscope is positioned in normal direction to said stage.

16. The method of claim 1, wherein said focusing is accomplished with respect to said alignment marks on said reflective layer in said wafer.

17. The method of claim 1, wherein said alignment is accomplished with respect to patterns in said aligner.

* * * * *